United States Patent
Hirai et al.

(10) Patent No.: US 9,620,367 B2
(45) Date of Patent: Apr. 11, 2017

(54) DIFFUSION AGENT COMPOSITION, METHOD OF FORMING IMPURITY DIFFUSION LAYER, AND SOLAR CELL

(75) Inventors: Takaaki Hirai, Kawasaki (JP); Atsushi Murota, Kawasaki (JP); Katsuya Tanitsu, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 1302 days.

(21) Appl. No.: 13/391,907

(22) PCT Filed: Aug. 18, 2010

(86) PCT No.: PCT/JP2010/005093
§ 371 (c)(1),
(2), (4) Date: Mar. 15, 2012

(87) PCT Pub. No.: WO2011/024408
PCT Pub. Date: Mar. 3, 2011

(65) Prior Publication Data
US 2012/0160306 A1   Jun. 28, 2012

(30) Foreign Application Priority Data

Aug. 27, 2009 (JP) .................. 2009-197328
Aug. 4, 2010 (JP) .................. 2010-175565

(51) Int. Cl.
*H01L 21/225* (2006.01)
*H01L 31/02* (2006.01)
(Continued)

(52) U.S. Cl.
CPC ........ *H01L 21/228* (2013.01); *H01L 21/2225* (2013.01); *H01L 31/068* (2013.01);
(Continued)

(58) Field of Classification Search
CPC ...................................... H01L 21/22
See application file for complete search history.

(56) References Cited

U.S. PATENT DOCUMENTS

| 6,695,903 B1* | 2/2004 | Kubelbeck ........... C09D 183/02 106/287.14 |
| 2002/0040094 A1* | 4/2002 | Takahashi et al. ........... 524/590 |

(Continued)

FOREIGN PATENT DOCUMENTS

| CN | 101167191 A | 4/2008 |
| CN | 101401189 A | 4/2009 |

(Continued)

OTHER PUBLICATIONS http://www.chemicalland21.com/industrialchem/solalc/DIPROPYLENE%20GLYCOL%20 (obtained Mar. 2, 2015).*

(Continued)

*Primary Examiner* — Gerard Higgins
*Assistant Examiner* — Sathavaram I Reddy
(74) *Attorney, Agent, or Firm* — Knobbe Martens Olson & Bear LLP (57) ABSTRACT

A diffusion agent composition including an impurity-diffusing component (A); a binder resin (B) that thermally decomposes and disappears below a temperature at which the impurity-diffusing component (A) begins to thermally diffuse; $SiO_2$ fine particles (C); and an organic solvent (D) that contains an organic solvent (D1) having a boiling point of at least 100° C.

7 Claims, 2 Drawing Sheets (51) Int. Cl.
- *C09D 133/02* (2006.01)
- *C09D 133/10* (2006.01)
- *C09D 133/12* (2006.01)
- *C09D 177/00* (2006.01)
- *H01L 21/228* (2006.01)
- *H01L 21/22* (2006.01)
- *H01L 31/068* (2012.01)
- *H01L 31/18* (2006.01)

(52) U.S. Cl.
CPC ........ *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 2004/0003836 A1* | 1/2004 | Watsuji et al. | 136/243 |
| 2007/0215202 A1 | 9/2007 | Salami et al. | |
| 2009/0229665 A1* | 9/2009 | Young | H01B 1/22 136/261 |
| 2010/0037946 A1* | 2/2010 | Yatabe | H01L 31/04 136/256 |

FOREIGN PATENT DOCUMENTS

| | | |
|---|---|---|
| EP | 1 876 651 A1 | 1/2008 |
| JP | 07-130675 | 5/1995 |
| JP | A-2001-049070 | 2/2001 |
| JP | 2001-093326 | 4/2001 |
| JP | 2002-539615 | 11/2002 |
| JP | 2003-069056 | 3/2003 |
| JP | 2003-209271 | 7/2003 |
| JP | 2005-347306 | 12/2005 |
| JP | A-2006-156646 | 6/2006 |
| JP | 2006-310373 | 11/2006 |
| JP | 2007-053353 | 3/2007 |
| JP | 2008-197370 | 8/2008 |
| JP | A-2008-306023 | 12/2008 |
| JP | 2010-056465 | 3/2010 |
| KR | 2008-0104179 | 12/2008 |

OTHER PUBLICATIONS

Krause, O. and Ryssel, H. "Determination of aluminum diffusion parameter in silicon". Journal of Applied Physics. vol. 91 #9. Published May 1, 2002.*

Machine Translation of JP 2007-053353.*

Office Action in European Patent Application No. 10811467.9 dated Aug. 12, 2014.

Office Action issued on Jun. 27, 2013 for Korean Patent Application No. 10-2012-7007502.

Office Action in corresponding Japanese Patent Application No. 2010-175565 dated Sep. 24, 2014.

Office Action issued on Jan. 15, 2014 in Chinese Patent Application No. 201080036913.9.

Office Action for Chinese Application No. 201080036913.9 dated Jan. 21, 2015.

Extended European Search Report mailed on Apr. 24, 2013 in European Patent Application No. 10811467.9.

International Preliminary Report on Patentability issued in PCT/JP2010/005093 dated Feb. 28, 2012 (English translation dated Mar. 13, 2012).

International Search Report issued in PCT/JP2010/005093 on Oct. 19, 2010.

Office Action issued on May 22, 2014 in Korean Patent Application No. 10-2012-7007502.

Office Action issued on Dec. 6, 2013 in Korean Patent Application No. 2012-7007502.

Office Action in European Patent Application No. 10811467.9, mailed on Jul. 20, 2015.

Office Action in Taiwanese Patent Application No. 099127953, dated Feb. 24, 2015.

* cited by examiner

DIFFUSION AGENT COMPOSITION, METHOD OF FORMING IMPURITY DIFFUSION LAYER, AND SOLAR CELL

This application is the U.S. National Phase under 35 U.S.C. §371 of International Application No. PCT/JP2010/005093, filed Aug. 18, 2010, designating the U.S., and published in Japanese as WO2011/024408 on Mar. 3, 2011, which claims priority to Japanese Patent Application No. 2009-197328, filed Aug. 27, 2009; and Japanese Patent Application No. 2010-175565, filed Aug. 4, 2010, the entire contents of which are incorporated herein by reference.

BACKGROUND OF THE INVENTION

Field of the Invention

The present invention relates to a diffusing agent composition, a method of forming an impurity diffusion layer, and a solar cell.

Description of the Related Art

According to the related art, in manufacturing a solar cell, a P-type or N-type impurity diffusion layer is formed in a semiconductor substrate by forming a coating film on a surface of the semiconductor substrate using a diffusing agent that contains an impurity diffusion component and then by causing the impurity diffusion component to diffuse from the coating film of the diffusing agent into the semiconductor substrate.

In manufacturing a solar cell, a spin coating method is often used as a method for applying a diffusing agent on a surface of a semiconductor substrate. However, efforts have been also made toward employment of a screen printing method and a roll coat printing method. In the screen printing method, a screen (printing plate) of mesh-like silk, synthetic resins, stainless steel, or the like is first stretched on a frame, and a part that allows a diffusing agent to pass and a part that does not allow a diffusing agent to pass are formed on the screen. The diffusing agent is then applied to the screen, and the applied diffusing agent is pushed out onto a surface of a semiconductor substrate using a squeegee. With this, the diffusing agent is transferred onto the surface of the semiconductor substrate, thereby forming a coating film of the diffusing agent in a predetermined pattern, line, or the like on the surface of the semiconductor substrate.

In the roll coat printing method, a printing roller (printing plate) on which a groove is formed along the circumference thereof and a pressing roller for pressing a semiconductor substrate against the printing roller are arranged facing each other at a short distance. Then, the printing roller and the pressing roller are rotated in directions opposite from each other while feeding the diffusing agent into the groove, and the semiconductor substrate is allowed to pass between these rollers. With this, the printing roller and the semiconductor substrate come into contact with each other with pressure, and the diffusing agent filling the groove of the printing roller is transferred onto the surface of the semiconductor substrate, thereby forming a coating film of the diffusing agent in a predetermined pattern, line, or the like on the surface of the semiconductor substrate.

For example, Patent Document No. 1 describes a dopant paste (diffusing agent composition) for use in these printing methods.

[Patent Document No. 1] JP 2002-539615 (published Japanese translation of PCT international publication for patent application)

As described above, efforts have been currently made toward employment of a screen printing method and a roll coat printing method in manufacturing a solar cell. However, it is difficult to form a coating film, using these methods, at a level that ensures practical use. One of the causes for this is that diffusing agents that can be preferably employed for these methods are not known. In other words, since a diffusing agent is applied to a mesh-like or roll-like printing plate in the above-stated screen printing method and roll coat printing method, the diffusing agent needs to have a predetermined viscosity. In order to provide a viscosity, the solid content concentration of a conventional diffusing agent is set to be high to some extent. However, this makes the diffusing agent easy to dry. When a diffusing agent applied to a printing plate is dried, print cracking is formed on a semiconductor substrate, preventing the formation of a favorable coating film.

Therefore, diffusing agents used for the screen printing method and roll coat printing method are required to be hard to dry while having a predetermined viscosity. Meanwhile, for diffusing agents, there is always a demand for the improvement of the ability to create a precise coating film form (pattern) when applied on the surface of a semiconductor, i.e., coating film formability, and the ability to uniformly diffuse over a predetermined region of the semiconductor substrate so as to reduce a resistance value at a diffusion region to a desired value, i.e., diffusibility.

The present invention provides a diffusing agent composition that can be preferably employed for a screen printing method and a roll coat printing method having excellent coating film formability and diffusibility; a method of forming an impurity diffusion layer using the diffusing agent composition; and a solar cell.

A diffusing agent composition according to one embodiment of the present invention that is used to print an impurity diffusion component onto a semiconductor substrate, comprises: an impurity diffusion component (A); a binder resin (B) configured to thermally decompose and disappear below a temperature, at which the impurity-diffusing component (A) starts diffusing thermally; a $SiO_2$ fine particle (C); and an organic solvent (D) configured to contain an organic solvent (D1) having a boiling point of at least 100 degrees Celsius.

According to this embodiment, a diffusing agent composition can be obtained that can be preferably employed for a screen printing method and a roll coat printing method having excellent coating film formability and diffusibility.

Another embodiment of the present invention relates to a method for forming an impurity diffusion layer, and the method for forming an impurity diffusion layer comprises: forming a coating film by printing the diffusing agent composition according to the above embodiment; and diffusing the impurity diffusion component (A) of the diffusing agent composition into a semiconductor substrate.

According to the embodiment, an impurity diffusion layer can be formed with higher accuracy.

Yet another embodiment of the present invention relates to a solar cell, and the solar cell comprises a semiconductor substrate in which an impurity diffusion layer is formed by the method of forming an impurity diffusion layer of the embodiment.

According to the embodiment, a more reliable solar cell can be obtained.

Embodiments will now be described, by way of example only, with reference to the accompanying drawings which are meant to be exemplary, not limiting, and wherein like elements are numbered alike in several Figures, in which:

DETAILED DESCRIPTION OF THE INVENTION

Described below is an explanation of the present invention based on preferred embodiments. Reference herein to details of the illustrated embodiments is not intended to limit the scope of the claims. It should be understood that not all of the features and the combination thereof discussed are essential to the invention.

The diffusing agent composition according to the present embodiment is used to print an impurity-diffusing component onto a semiconductor substrate and contains an impurity-diffusing component (A), a binder resin (B), $SiO_2$ fine particles (C), and an organic solvent (D).

Each component of the diffusing agent composition according to the present embodiment is described in detail in the following.

<<Impurity-Diffusing Component (A)>>

The impurity-diffusing component (A) is a compound generally used as a dopant for manufacturing a solar cell. The impurity diffusion component (A) is an N-type impurity diffusion component containing a compound of an element in the Group V (the Group 15) or a P-type impurity diffusion component containing a compound of an element in the Group III (the Group 13). In the step of forming an electrode in a solar cell, the impurity diffusion component (A) allows for the formation of an N-type or P-type impurity diffusion layer (impurity diffusion region) in a semiconductor substrate. The N-type impurity-diffusing component containing a compound of an element in the Group V allows for the formation, in a process of forming an electrode of a solar cell, of an N-type impurity diffusion layer in a P-type semiconductor substrate and an $N^+$-type (high concentration N-type) impurity diffusion layer in an N-type semiconductor substrate. Examples of the compound of an element in the Group V contained in the impurity-diffusing component (A) include $P_2O_5$, $Bi_2O_3$, $Sb(OCH_2CH_3)_3$, $SbCl_3$, $As(OC_4H_9)_3$, or the like, and the impurity-diffusing component (A) contains at least one kind of these compounds. The P-type impurity-diffusing component containing a compound of an element in the Group III allows for the formation, in a process of forming an electrode of a solar cell, of a P-type impurity diffusion layer in an N-type semiconductor substrate and a $P^+$-type (high concentration P-type) impurity diffusion layer in a P-type semiconductor substrate. Examples of the compound of an element in the Group III contained in the impurity-diffusing component (A) include $B_2O_3$, $Al_2O_3$, or the like, and the impurity-diffusing component (A) contains at least one kind of these compounds.

The amount of the impurity-diffusing component (A) to be added is appropriately adjusted in accordance with, for example, the thickness of an impurity diffusion layer formed in a semiconductor substrate. The amount of the impurity-diffusing component (A) to be added is preferably 5 to 60 percent by mass and more preferably 15 to 50 percent by mass with respect to the entire mass of the solid components of the impurity-diffusing component (A), the binder resin (B), and the $SiO_2$ fine particles (C) (when the mass of the solid components is set to be 100). When the amount of the impurity-diffusing component (A) to be added is at least 5 percent by mass, further improved diffusibility can be obtained. When the amount of the impurity-diffusing component (A) to be added is 60 percent by mass or less, a more stable solution and further improved coating film formability can be obtained.

<<Binder Resin (B)>>

The binder resin (B) has a property of allowing the impurity-diffusing component (A) to diffuse well. Therefore, the binder resin (B) plays a role of allowing the impurity-diffusing component (A) to diffuse uniformly in a diffusing agent composition and thereby allowing the impurity-diffusing component (A) to diffuse uniformly on the surface of a semiconductor substrate. The binder resin (B) thermally decomposes and disappears below a temperature, at which the impurity-diffusing component (A) starts diffusing thermally. Therefore, carbon is not left on the surface of the semiconductor substrate when the impurity-diffusing component (A) diffuses thermally. This prevents a situation where carbon diffuses in the semiconductor substrate along with the thermal diffusion of the impurity-diffusing component (A) and which prevents a desired resistance value from being obtained or which causes a variation in the resistance value.

In other words, such a binder resin (B) allows for the improvement of the diffusibility of a diffusing agent composition and for the adjustment of the resistance value at a region of a semiconductor substrate, where the diffusing agent composition has diffused, to a desired value with high accuracy. The "temperature, at which the impurity-diffusing component (A) starts diffusing thermally" is a temperature at which an impurity-diffusing component starts entering inside the semiconductor substrate from the surface of the semiconductor substrate, e.g., a temperature at which the impurity-diffusing component has entered inside the semiconductor substrate by an amount of about 10 nm and preferably about 1 nm from the boundary between the semiconductor substrate and the diffusing agent composition. The situation where the "binder resin (B) thermally decomposes and disappears" described above means, e.g., a situation where the binder resin loses about 95 percent, preferably about 99 percent, and most preferably 100 percent of the entire mass of the binder resin.

The binder resin (B) is preferably a resin whose decomposition temperature is below a temperature, which is lower than the temperature at which the impurity-diffusing component (A) starts diffusing thermally by 200 degrees Celsius, or a resin whose decomposition temperature is below 400 degrees Celsius. Also, the binder resin (B) is preferably a resin, 80 percent by mass of which thermally decomposes at a heating temperature of 500 degrees Celsius. According to these, prevention of a condition where there is a carbon residue at the time of the thermal diffusion of the impurity-diffusing component (A) can be further ensured. The "decomposition temperature" is a temperature at which the mass of the binder resin starts to decrease, e.g., a temperature at which the binder resin is reduced by about 5 percent and preferably about 1 percent of the entire mass of the binder resin.

The binder resin (B) is preferably a non-silicon resin. If the binder resin (B) is a silicon resin, a diffusing agent composition attached to a printing plate of a screen printing machine or a roll coater may be fixed to the printing plate when dried. In order to remove the diffusing agent composition fixed to the printing plate, it is necessary to wash the printing plate using hydrofluoric acid (HF). In this case, the hydrofluoric acid attached to the printing plate may attach to metal parts of a printing machine and decompose these metal parts. In addition, since hydrofluoric acid is deleterious, a risk associated with the operation of removing the diffusing agent composition will be increased. On the other hand, by forming the binder resin (B) by a non-silicon resin, the diffusing agent composition dried on the printing plate can be washed off using an organic solvent such as acetone, isobutanol, or the like. Therefore, the diffusing agent composition according to the present embodiment can be easily handled.

Preferably, the binder resin (B) contains an acrylic resin. The acrylic resin contained in the binder resin (B) preferably has a butyral group. Specific examples of the binder resin (B) include an acrylic resin composed of a polymerizable monomer such as methyl methacrylate (MMA), methacrylic acid (MAA), isobutyl methacrylate (i-BMA), tertiary-butyl methacrylate (t-BMA), acrylic acid, ethyl acrylate, methyl acrylate, butyl acrylate, hydroxyethyl acrylate, hydroxypropyl acrylate, isobutyl acrylate, ethyl methacrylate, butyl methacrylate, hydroxypropyl methacrylate, or the like.

The amount of the binder resin (B) to be added is preferably 5 to 60 percent by mass and more preferably 15 to 50 percent by mass with respect to the entire mass of the solid components of the impurity-diffusing component (A), the binder resin (B), and the $SiO_2$ fine particles (C). When the amount of the binder resin (B) to be added is at least 5 percent by mass, the coating film formability becomes further improved such that a uniform coating film (printing film) can be formed. Thus, further improved diffusibility can be obtained. When the amount of the binder resin (B) to be added is 60 percent by mass or less, a more stable solution and further improved diffusibility can be obtained.

<<$SiO_2$ Fine Particles (C)>>

$SiO_2$ fine particles (C) are added as filler. The compatibility of the impurity-diffusing component (A) with the binder resin (B) can be improved by the addition of the $SiO_2$ fine particles (C). When the compatibility of the impurity-diffusing component (A) with the binder resin (B) is improved, the impurity-diffusing component (A) can be more uniformly applied on the surface of a semiconductor substrate. As a result, the impurity-diffusing component (A) can be more uniformly diffused on the semiconductor substrate. Therefore, the diffusibility of a diffusing agent composition can be improved by the $SiO_2$ fine particles (C). Regarding the size of the $SiO_2$ fine particles (C), the average particle size is preferably about 1 μm or less.

Specific examples of the $SiO_2$ fine particles (C) include fumed silica and the like. The amount of the $SiO_2$ fine particles (C) to be added is preferably 5 to 60 percent by mass and more preferably 15 to 50 percent by mass with respect to the entire mass of the solid components of the impurity-diffusing component (A), the binder resin (B), and the $SiO_2$ fine particles (C). When the amount of the $SiO_2$ fine particles (C) to be added is at least 5 percent by mass, a more stable solution and further improved diffusibility can be obtained. When the amount of the $SiO_2$ fine particles (C) to be added is 60 percent by mass or less, further improved coating film formability and further improved diffusibility can be obtained. If the $SiO_2$ fine particles (C) are not added, a solution is not likely to be stabilized, and mottling of a coating film is caused. Thus, good diffusibility cannot be obtained.

<<Organic Solvent (D)>>

An organic solvent (D) contains an organic solvent (D1) having a boiling point of at least 100 degrees Celsius. Since the boiling point of the organic solvent (D1) is at least 100 degrees Celsius, a diffusing agent composition can be prevented from becoming dry. Thus, when the diffusing agent composition is applied to a printing plate used for a roll coat printing method and a screen printing method, a situation can be prevented where the diffusing agent composition becomes dry and fixed on the printing plate. Therefore, by containing the organic solvent (D), the generation of print cracking on a coating film printed onto a semiconductor substrate can be prevented. In other words, the coating film formability of the diffusing agent composition is improved by the organic solvent (D). The organic solvent (D) preferably contains the organic solvent (D1) such that the organic solvent (D1) accounts for at least 10 percent by mass of the entire mass of the organic solvent (D). When the amount of the organic solvent (D1) contained in the organic solvent (D) is less than 10 percent by mass, an obtained drying prevention effect is small, and there is a possibility that print cracking is generated on a coating film formed on the surface of a semiconductor substrate.

The organic solvent (D1) includes ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol monomethyl ether, diethylene glycol monoethyl ether, diethylene glycol monophenyl ether, diethylene glycol dimethyl ether, diethylene glycol diethyl ether, triethylene glycol monomethyl ether, triethylene glycol monoethyl ether, triethylene glycol dimethyl ether, triethylene glycol diethyl ether, tripropylene glycol monomethyl ether, tripropylene glycol monoethyl ether, tripropylene glycol dimethyl ether, tripropylene glycol diethyl ether, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-methoxy butyl acetate, 3-methoxy butyl acetate, 4-methoxy butyl acetate, 2-methyl-3-methoxy butyl acetate, 3-methyl-3-methoxy butyl acetate, 3-ethyl-3-methoxy butyl acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, methyl isobutyl ketone, ethyl isobutyl ketone, cyclohexanone, propyl propionate, isopropyl propionate, methyl-3-methoxy propionate, ethyl-3-methoxy propionate, ethyl-3-ethoxy propionate, ethyl-3-propoxy propionate, propyl-3-methoxy propionate, isopropyl-3-methoxy propionate, butyl acetate, isoamyl acetate, methyl acetoacetate, ethyl acetoacetate, methyl lactate, ethyl lactate, butyl lactate, ethylhexyl lactate, benzyl methyl ether, benzyl ethyl ether, dihexyl ether, benzyl acetate, ethyl benzoate, diethyl oxalate, diethyl maleate, γ-butyrolactone, benzene, toluene, xylene, cyclohexanone, butanol, isobutanol, 3-methyl-3-methoxybutanol, hexanol, cyclohexanol, ethylene glycol, diethylene glycol, dipropylene glycol, glycerin, terpineol, dipropylene glycol monomethyl ether, or the like. The organic solvent (D) includes a mixture of the above-stated organic solvent (D1) and ethanol, isopropanol, methyl ethyl ketone, acetone, ethyl acetate, methanol, n-hexane, cyclohexane, or the like.

The concentration of a metallic impurity contained in the diffusing agent composition is preferably 500 ppm or less. This can suppress a decrease in the efficiency of a photovoltaic effect, which is caused by the inclusion of the metallic impurity. The diffusing agent composition according to the present embodiment may contain a commonly-used surface-active agent, antifoaming agent, or the like as another additive agent. The ratio of the solid components (solid content concentration) with respect to the entire mass of the diffusing agent composition can be appropriately changed based on a printing method and is preferably 5 to 90 percent by mass.

<<Method of Forming Impurity Diffusion Layer and Method of Manufacturing Solar Cell>>

In reference to FIGS. 1 and 2, a detailed description will be made regarding a method of forming an impurity diffusion layer using a roll coat method or a screen printing method and regarding a method of manufacturing a solar cell provided with a semiconductor substrate in which the impurity diffusion layer is formed by the method of forming an impurity diffusion layer. FIG. 1A through FIG. 1D and FIG. 2A through FIG. 2D are process sectional views for explaining a method of manufacturing a solar cell including a method of forming an impurity diffusion layer according to an embodiment of the invention. A method of forming an N-type impurity diffusion layer in a P-type semiconductor substrate is explained as an example. Alternatively, for example, a P-type impurity diffusion layer can be formed in an N-type semiconductor substrate.

The method of forming an impurity diffusion layer according to the present embodiment comprises: a step of forming a coating film by printing the above-described diffusing agent composition containing an impurity-diffusing component (A) onto a semiconductor substrate; and a step of diffusing the impurity-diffusing component (A) contained in the diffusing agent composition into the semiconductor substrate.

Figure 1A:
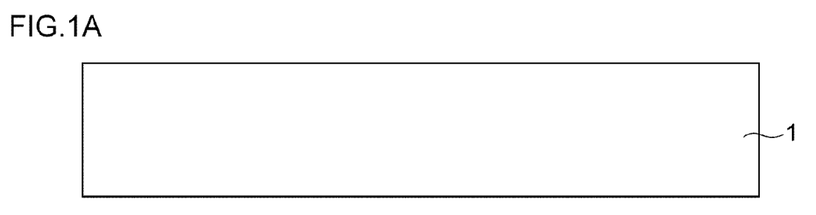
FIG. 1A through FIG. 1D are process sectional views for explaining a method of manufacturing a solar cell including a method of forming an impurity diffusion layer according to an embodiment of the invention.
Figure 1B:
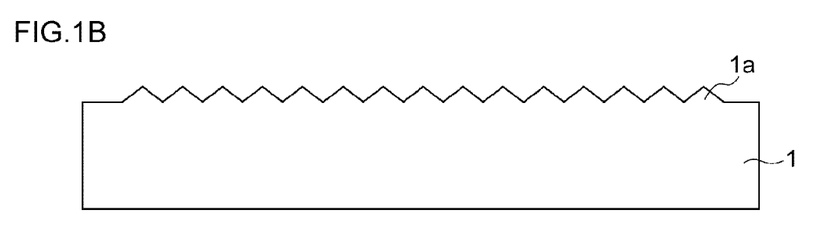
Figure 1C:
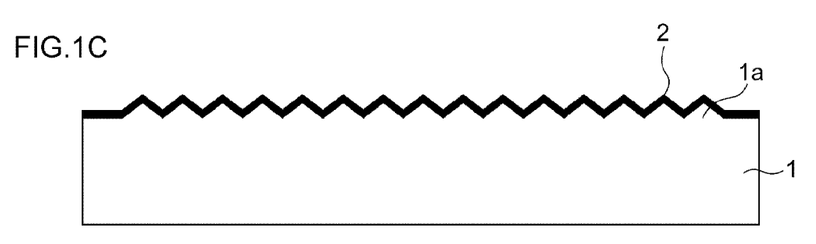

As shown in FIG. 1A, a P-type semiconductor substrate 1 such as a silicon substrate is prepared first. Next, as shown in FIG. 1B, a texture portion 1a having a fine relief structure is formed on one main surface of the semiconductor substrate 1 by a well-known wet etching method. The texture portion 1a prevents reflection of light on the surface of the semiconductor substrate 1. Then, as shown in FIG. 1C, a diffusing agent composition 2 containing an N-type impurity-diffusing component (A) as described above is applied onto the main surface of the semiconductor substrate 1 on the side of the texture portion 1a.

The diffusing agent composition 2 is applied onto the surface of the semiconductor substrate 1 by a roll coat printing method or a screen printing method. In other words, in the case of a roll coat printing method, a printing roller provided on a well-known roll coater is filled with the diffusing agent composition 2, and the diffusing agent composition 2 is printed onto the semiconductor substrate 1 by allowing the semiconductor substrate 1 to pass between the printing roller and a roller arranged to face the printing roller. In the case of a screen printing method, the diffusing agent composition 2 is applied to a screen provided on a well-known screen printing machine, and the diffusing agent composition 2 is printed onto the semiconductor substrate 1 by pushing out the diffusing agent composition 2 onto the surface of the semiconductor substrate 1 using a squeegee. After a coating film is formed as described above, the applied diffusing agent composition 2 is dried using a well-known means such as an oven.

Figure 1D:
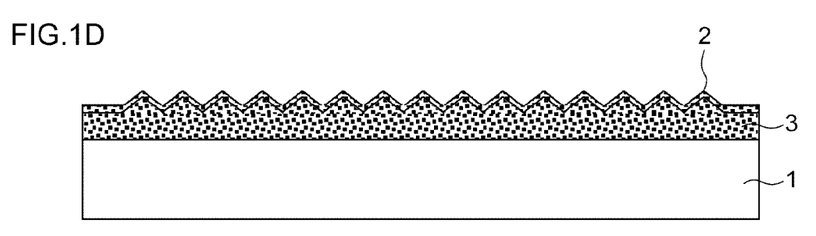

Then, as described in FIG. 1D, the semiconductor substrate 1 on which the diffusing agent composition 2 is applied is placed inside an electric furnace and then burned. After the burning of the semiconductor substrate 1, the N-type impurity-diffusing component (A) in the diffusing agent composition 2 is allowed to diffuse into the semiconductor substrate 1 through the surface of the semiconductor substrate 1 in the electric furnace. Instead of an electric furnace, the semiconductor substrate 1 may be heated by commonly-used laser irradiation. In this way, the N-type impurity diffusion component (A) is diffused into the semiconductor substrate 1 to form an N-type impurity diffusion layer 3.

Figure 2A:
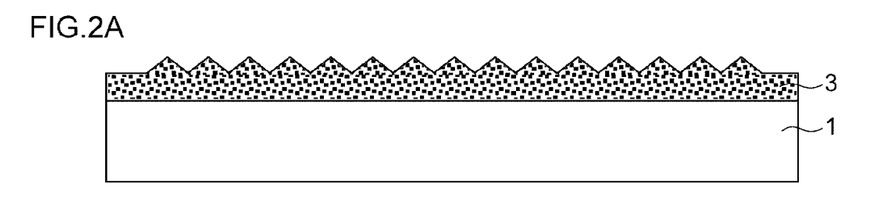
FIG. 2A through FIG. 2D are process sectional views for explaining a method of manufacturing a solar cell including a method of forming an impurity diffusion layer according to an embodiment of the invention.
Figure 2B:
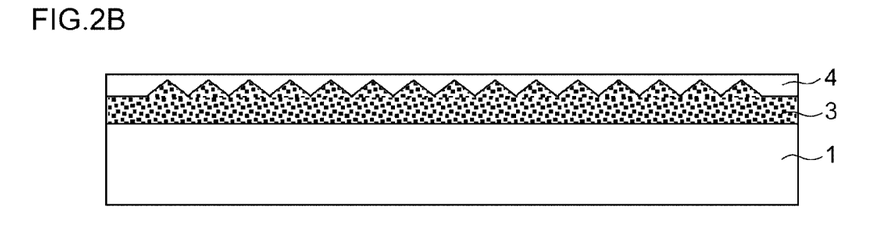

As shown in FIG. 2A, the diffusing agent composition 2 is then removed by a well-known etching method. Next, as shown in FIG. 2B, a passivation film 4 composed of a silicon nitride film (SiN film) is formed on the main surface of the semiconductor substrate 1 on the side of the texture portion 1a using a well-known chemical vapor deposition method (CVD method), e.g., a plasma CVD method. The passivation film 4 also functions as an antireflective film.

Figure 2C:
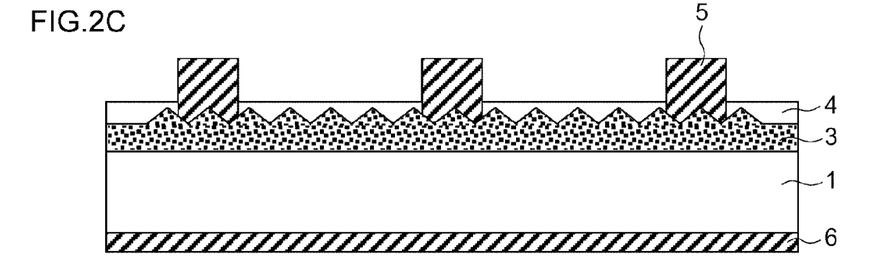

Next, as shown in FIG. 2C, a pattern of a surface electrode 5 is made on the main surface of the semiconductor substrate 1 on the side of the passivation film 4 by screen printing a silver (Ag) paste. The surface electrode 5 is formed into, e.g., a comb-shaped pattern, etc., to improve the efficiency of a solar cell. Also, a backside electrode 6 is formed on the other main surface of the semiconductor substrate 1 by screen printing an aluminum (Al) paste.

Figure 2D:
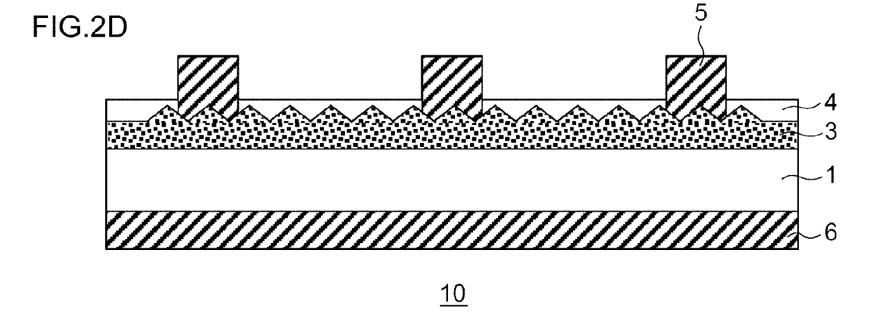

Then, as shown in FIG. 2D, the semiconductor substrate 1 on which the backside electrode 6 is formed is placed inside an electric furnace and then burned, and aluminum forming the backside electrode 6 then diffuses into the semiconductor substrate 1. This allows for the reduction in electrical resistance on the side of the backside electrode 6. With these steps, a solar cell 10 according to the embodiment can be manufactured.

As explained above, the diffusing agent composition according to the present embodiment contains: the impurity-diffusing component (A); the binder resin (B) that thermally decomposes and disappears below a temperature, at which the impurity-diffusing component (A) starts diffusing thermally; the $SiO_2$ fine particles (C); and the organic solvent (D) that contains the organic solvent (D1) having a boiling point of at least 100 degrees Celsius. Therefore, the diffusing agent composition according to the present embodiment leaves almost no carbon residue at the time of the thermal diffusion of the impurity-diffusing component (A) and has high diffusibility. In addition, since the diffusing agent composition according to the present embodiment is hard to dry, creating a little print cracking, the diffusing agent composition has high coating film formability. Since the diffusing agent composition according to the present embodiment can be removed easily with an organic solvent for washing even when dried, the diffusing agent composition can be preferably employed for a screen printing method and a roll coat printing method. When forming an impurity diffusion layer using the diffusing agent composition, the impurity diffusion layer can be formed with higher accuracy. Further, the use of the diffusing agent composition allows for more accurate coating film formation, improving the reliability of a solar cell.

When a resin having a decomposition temperature of less than a temperature, which is lower than the temperature at which the impurity-diffusing component (A) starts diffusing thermally by 200 degrees Celsius, or a resin having a decomposition temperature of less than 400 degrees Celsius is used as the binder resin (B), a probability where there exists a carbon residue when the impurity-diffusing component (A) starts diffusing thermally can be reduced, and the diffusibility of the diffusing agent composition can thus be further improved. When the binder resin (B) is a non-silicon resin, ability to easily wash for removal with a less toxic organic solvent, i.e., apparatus washability can be improved.

Further, when the organic solvent (D) contains the organic solvent (D1) such that the organic solvent (D1) accounts for at least 10 percent by mass of the entire mass of the organic solvent (D), a probability of causing print cracking can be reduced, and the coating film formability of the diffusing agent composition can thus be improved.

When a roll coat printing method or a screen printing method is used in the method of forming an impurity diffusion layer and the method of manufacturing a solar cell, an impurity diffusion region can be selectively provided at a desired position. Therefore, in comparison to a conventional method, consumption of the diffusing agent composition can be suppressed, while no complicated step is required. With this, manufacturing cost of a solar cell can be reduced.

The invention is not limited to the above-mentioned embodiments, and various modifications, such as a design change, may be added thereto on the basis of knowledge of those skilled in the art. It should be understood that any embodiment to which one or more of the modifications are added is also included in the scope of the invention. New embodiments resulting from combinations of the aforementioned embodiments and the following exemplary variations will provide the advantages of the embodiment and variations combined.

In the above embodiment, the diffusing agent composition is printed onto the semiconductor substrate by a roll coat printing method or a screen printing method; however, other printing methods can be employed such as a spin-on method, a spray printing method, an ink-jet printing method, a letterpress printing method, an intaglio printing method, or the like.

[Exemplary Embodiment]

The invention will now be described by reference to the preferred exemplary embodiments. This does not intend to limit the scope of the present invention, but to exemplify the invention.

(Production of Diffusing Agent Composition)

In accordance with the components and content ratios described in the following Tables 1-4, the impurity-diffusing component (A), the binder resin (B), the $SiO_2$ fine particles (C), and the organic solvent (D) were mixed such that each component was diffused uniformly, and diffusing agent compositions according to exemplary embodiments 1-17 and comparative examples 1-5 were obtained.

TABLE 1

|  |  | EXEMPLARY EMBODIMENT 1 | EXEMPLARY EMBODIMENT 2 | EXEMPLARY EMBODIMENT 3 | EXEMPLARY EMBODIMENT 4 |
|---|---|---|---|---|---|
| IMPURITY-DIFFUSING COMPONENT(A) (MASS %) | | $P_2O_5$: 22.5 | $P_2O_5$: 22.5 | $P_2O_5$: 22.5 | $P_2O_5$: 9.0 |
| BINDER RESIN (B) | COMPOSITION (MOLAR RATIO) | MMA/MAA (8/2) | i-BMA/MAA(8/2) | i-BMA/MAA(8/2) | i-BMA/MAA(8/2) |
| | CONTAINED AMOUNT (MASS %) | 16.25 | 16.25 | 16.25 | 6.50 |
| | DECOMPOSITION TEMPERATURE(° C.) | 280° C. | 250° C. | 250° C. | 250° C. |
| $SiO_2$ FINE PARTICLES (C) (MASS %) | | AEROSIL 200: 11.25 MASS % | AEROSIL 200: 11.25 MASS % | AEROSIL 200: 11.25 MASS % | AEROSIL 200: 4.50 MASS % |
| ORGANIC SOLVENT (D) (MASS %) | ORGANIC SOLVENT (D1) (MASS %) | ETHANOL: 10 TERPINEOL: 40.0 | — TERPINEOL: 50.0 | ETHANOL: 10 TERPINEOL: 40.0 | ETHANOL: 16 TERPINEOL: 64.0 |
| CARBON RESIDUE | | NO | NO | NO | NO |
| SCREEN PRINTING SHEET RESISTANCE VALUE(Ω/sq.) | | 25 | 20 | 20 | — |
| ROLL COAT PRINTING SHEET RESISTANCE VALUE(Ω/sq.) | | 40 | 32 | 34 | 55 |
| DRYING CHARACTERISTICS (PRINT CRACKING) | | AA | AA | AA | AA |
| APPARATUS WASHABILITY | | ACETONE: A | ACETONE: A | ACETONE: A | ACETONE: A |

|  |  | EXEMPLARY EMBODIMENT 5 | EXEMPLARY EMBODIMENT 6 | EXEMPLARY EMBODIMENT 7 |
|---|---|---|---|---|
| IMPURITY-DIFFUSING COMPONENT(A) (MASS %) | | $P_2O_5$: 9.0 | $P_2O_5$: 9.0 | $P_2O_5$: 22.5 |
| BINDER RESIN (B) | COMPOSITION (MOLAR RATIO) | ACA 200M | MACROMELT OM652 | MMA/MAA (8/2) |
| | CONTAINED AMOUNT (MASS %) | 6.50 | 6.50 | 16.25 |
| | DECOMPOSITION TEMPERATURE(° C.) | 340° C. | 370° C. | 280° C. |
| $SiO_2$ FINE PARTICLES (C) (MASS %) | | AEROSIL 200: 4.50 MASS % | AEROSIL 200: 4.50 MASS % | AEROSIL 200: 11.25 MASS % |
| ORGANIC SOLVENT (D) (MASS %) | ORGANIC SOLVENT (D1) (MASS %) | ETHANOL: 16 DIPROPYLENE GLYCOL MONOMETHYL ETHER: 64.0 | — ISOBUTANOL: 53.3 TOLUENE: 26.7 | ETHANOL: 46 TERPINEOL: 4.0 |

TABLE 1-continued

|  |  |  |  |
|---|---|---|---|
| CARBON RESIDUE | NO | NO | NO |
| SCREEN PRINTING SHEET RESISTANCE VALUE($\Omega$/sq.) | — | — | 25 |
| ROLL COAT PRINTING SHEET RESISTANCE VALUE($\Omega$/sq.) | 85 | 74 | 40 |
| DRYING CHARACTERISTICS (PRINT CRACKING) | AA | AA | A |
| APPARATUS WASHABILITY | ACETONE: A | ISOBUTANOL: A | ACETONE: A |

TABLE 2

|  |  | EXEMPLARY EMBODIMENT 8 | EXEMPLARY EMBODIMENT 9 | EXEMPLARY EMBODIMENT 10 | EXEMPLARY EMBODIMENT 11 |
|---|---|---|---|---|---|
| IMPURITY-DIFFUSING COMPONENT(A) (MASS %) | | $P_2O_5$: 22.5 | $B_2O_3$: 7.8 | $Al_2O_3$: 7.8 | $B_2O_3$: 7.8 |
| BINDER RESIN (B) | COMPOSITION (MOLAR RATIO) | i-BMA/MAA(8/2) | i-BMA/MAA(8/2) | i-BMA/MAA(8/2) | i-BMA/MAA(8/2) |
|  | CONTAINED AMOUNT (MASS %) | 16.25 | 21.50 | 21.50 | 21.50 |
|  | DECOMPOSITION TEMPERATURE(° C.) | 250° C. | 250° C. | 250° C. | 250° C. |
| $SiO_2$ FINE PARTICLES (C) (MASS %) | | AEROSIL 200: 11.25 MASS % | AEROSIL 200: 6.70 MASS % | AEROSIL 200: 6.70 MASS % | AEROSIL 200: 6.70 MASS % |
| ORGANIC SOLVENT (D) (MASS %) | ORGANIC SOLVENT (D1) (MASS %) | ETHANOL: 10 TRIPROPYLENE GLYCOL MONOMETHYL ETHER: 40.0 | TERPINEOL: 64.0 | TERPINEOL: 64.0 | TRIPROPYLENE GLYCOL MONOMETHYL ETHER: 64.0 |
| CARBON RESIDUE | | NO | NO | NO | NO |
| SCREEN PRINTING SHEET RESISTANCE VALUE($\Omega$/sq.) | | 25 | 65 | 85 | 57 |
| ROLL COAT PRINTING SHEET RESISTANCE VALUE($\Omega$/sq.) | | — | — | — | — |
| DRYING CHARACTERISTICS (PRINT CRACKING) | | AA | AA | AA | AA |
| APPARATUS WASHABILITY | | ACETONE: A | ACETONE: A | ACETONE: A | ACETONE: A |

|  |  | EXEMPLARY EMBODIMENT 12 | EXEMPLARY EMBODIMENT 13 | EXEMPLARY EMBODIMENT 14 |
|---|---|---|---|---|
| IMPURITY-DIFFUSING COMPONENT(A) (MASS %) | | $P_2O_5$: 5.0 | $P_2O_5$: 30.0 | $P_2O_5$: 23.75 |
| BINDER RESIN (B) | COMPOSITION (MOLAR RATIO) | i-BMA/MAA(8/2) | i-BMA/MAA(8/2) | i-BMA/MAA(8/2) |
|  | CONTAINED AMOUNT (MASS %) | 22.5 | 7.0 | 2.5 |
|  | DECOMPOSITION TEMPERATURE(° C.) | 250° C. | 250° C. | 250° C. |
| $SiO_2$ FINE PARTICLES (C) (MASS %) | | AEROSIL 200: 22.5 MASS % | AEROSIL 200: 13.0 MASS % | AEROSIL 200: 23.75 MASS % |
| ORGANIC SOLVENT (D) (MASS %) | ORGANIC SOLVENT (D1) (MASS %) | ETHANOL: 10 TERPINEOL: 40.0 | ETHANOL: 10 TERPINEOL: 40.0 | ETHANOL: 10 TERPINEOL: 40.0 |
| CARBON RESIDUE | | NO | NO | NO |
| SCREEN PRINTING SHEET RESISTANCE VALUE($\Omega$/sq.) | | 150 | 41 | 45 |
| ROLL COAT PRINTING SHEET RESISTANCE VALUE($\Omega$/sq.) | | — | — | — |
| DRYING CHARACTERISTICS (PRINT CRACKING) | | AA | AA | AA |
| APPARATUS WASHABILITY | | ACETONE: A | ACETONE: A | ACETONE: A |

TABLE 3

|  |  | EXEMPLARY EMBODIMENT 15 | EXEMPLARY EMBODIMENT 16 | EXEMPLARY EMBODIMENT 17 |
|---|---|---|---|---|
| IMPURITY-DIFFUSING COMPONENT(A) (MASS %) | | $P_2O_5$: 10.0 | $P_2O_5$: 10.0 | $P_2O_5$: 23.75 |
| BINDER RESIN (B) | COMPOSITION (MOLAR RATIO) | i-BMA/MAA(8/2) | i-BMA/MAA(8/2) | i-BMA/MAA(8/2) |
| | CONTAINED AMOUNT (MASS %) | 30.0 | 10.0 | 23.75 |
| | DECOMPOSITION TEMPERATURE (° C.) | 250° C. | 250° C. | 250° C. |
| $SiO_2$ FINE PARTICLES (C) (MASS %) | | AEROSIL 200: 10.0 MASS % | AEROSIL 200: 30.0 MASS % | AEROSIL 200: 2.5 MASS % |
| ORGANIC SOLVENT (D) (MASS %) | ORGANIC SOLVENT (D1) (MASS %) | ETHANOL: 10 TERPINEOL: 40.0 | ETHANOL: 10 TERPINEOL: 40.0 | ETHANOL: 10 TERPINEOL: 40.0 |
| CARBON RESIDUE | | NO | NO | NO |
| SCREEN PRINTING SHEET RESISTANCE VALUE(Ω/sq.) | | 85 | 110 | 36 |
| ROLL COAT PRINTING SHEET RESISTANCE VALUE(Ω/sq.) | | — | — | — |
| DRYING CHARACTERISTICS (PRINT CRACKING) | | AA | AA | AA |
| APPARATUS WASHABILITY | | ACETONE: A | ACETONE: A | ACETONE: A |

TABLE 4

|  |  | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|---|
| IMPURITY-DIFFUSING COMPONENT(A) (MASS %) | | $P_2O_5$: 9.0 | $P_2O_5$: 9.0 | $P_2O_5$: 1.5 | $P_2O_5$: 22.5 | $P_2O_5$: 16.65 |
| BINDER RESIN (B) | COMPOSITION (MOLAR RATIO) | MACROMELT 6900 | MACROMELT 6900 | TETRAETHOXYSILANE HYDROLYSATE PRODUCT | MMA/MAA (8/2) | i-BMA/MAA(8/2) |
| | CONTAINED AMOUNT (MASS %) | 6.50 | 6.50 | 8.50 ($SiO_2$ CONVERSION) | 16.25 | 33.35 |
| | DECOMPOSITION TEMPERATURE (° C.) | 400° C. | 400° C. | 1000° C. OR HIGHER | 280° C. | 250° C. |
| $SiO_2$ FINE PARTICLES (C) (MASS %) | | AEROSIL 200: 4.50 MASS % | AEROSIL 200: 4.50 MASS % | — | AEROSIL 200: 11.25 MASS % | — |
| ORGANIC SOLVENT (D) (MASS %) | | — | ISOPROPANAL: 60.0 | ETHANOL: 85.0 ISOPROPANOL: 5.0 | ETHANOL: 50 | ETHANOL: 10 |
| | ORGANIC SOLVENT (D1) (MASS %) | ISOBUTANOL: 53.3 TOLUENE: 26.7 | ISOBUTANOL: 20.0 | — | — | TERPINEOL: 40.0 |
| CARBON RESIDUE | | YES | YES | NO | NO | NO |
| SCREEN PRINTING SHEET RESISTANCE VALUE(Ω/sq.) | | — | — | 176 | 25 | 270 |
| ROLL COAT PRINTING SHEET RESISTANCE VALUE(Ω/sq.) | | 650 | 650 | — | 40 | — |
| DRYING CHARACTERISTICS (PRINT CRACKING) | | AA | AA | B | B | AA |
| APPARATUS WASHABILITY | | ISOBUTANOL: A | ISOBUTANOL: A | B | ACETONE: A | ACETONE: A |

NOTE
MMA: methyl methacrylate
MAA: methacrylic acid
i-BMA: isobutyl methacrylate
ACA 200M: acrylic resin (manufactured by DAICEL-CYTEC Company, Ltd.)
Macromelt OM652: polyamide resin (manufactured by Henkel Corporation)
Macromelt 6900: polyamide resin (manufactured by Henkel Corporation)
AEROSIL 200: fumed silica (manufactured by Nippon Aerosil Co., Ltd.)
The ratio (percent by mass) of each constituting component is a ratio with respect to the entire mass of the diffusing agent composition.

(Formation of Impurity Diffusion Layer)

The diffusing agent compositions according to exemplary embodiments 1-3, 7, 8, and 12-17 and comparative examples 3-5 were screen printed onto a P-type semiconductor substrate using a screen printing machine (MT 2030 manufactured by Murakami Techno Co., Ltd.). The diffusing agent compositions according to the exemplary embodiments 9-11 were screen printed onto an N-type semiconductor substrate using the same screen printing machine. As a printing condition, the printing pressure, squeegee speed, and squeegee hardness were set to be 4.2 kgf/cm$^2$, 3.52 cm/sec, and 70 degrees, respectively. The diffusing agent compositions according to the exemplary embodiments 1-7 and the comparative examples 1, 2, and 4 were roll-coat printed onto a P-type semiconductor substrate using a roll coater (RC-353-P manufactured by Dainippon Screen Mfg. Co., Ltd.). After printing each diffusing agent composition, the semiconductor substrates were placed on a hotplate and dried for three minutes at 150 degrees Celsius. The semiconductor substrates were then placed in an electric furnace and heated for burning for 30 minutes at 600 degrees Celsius in an $O_2$ atmosphere. The semiconductor substrates were heated for 30 minutes at 900 degreed Celsius in an $N_2$ atmosphere for the exemplary embodiments 1-8 and 12-17 and for the comparative examples 1-5, and the semiconductor substrates were heated for 30 minutes at 950 degreed Celsius in an $N_2$ atmosphere for the exemplary embodiments 9-11, so as to allow the impurity-diffusing component (A) to diffuse thermally. A phospho-silicate glass film (PSG film) formed on the respective surfaces of the semiconductor substrates due to the thermal diffusion was peeled by hydrofluoric acid (hydrogen fluoride). The binder resin (B) whose decomposition temperature is less than 400 degrees Celsius corresponds to a binder resin that thermally decomposes and disappears below a temperature, at which the impurity-diffusing component (A) starts diffusing thermally, and also corresponds to a binder resin whose decomposition temperature is lower than the temperature at which the impurity-diffusing component (A) starts diffusing thermally by 200 degrees Celsius.

(Apparatus Washability Evaluation)

The diffusing agent compositions attached to a screen used for screen printing or a printing roll used for roll coat printing were washed off using organic solvents that do not decompose metal parts of a printing machine and visually evaluated for whether or not the attached diffusing agent compositions were removed (A: removed, B: not removed and left a residue). The organic solvents that were used are as shown in Tables 1-4. The results of the exemplary embodiments 1-7, the results of the exemplary embodiments 8-14, the results of the exemplary embodiments 15-17, and the results of the comparative examples 1-5 are shown in Tables 1, 2, 3, and 4, respectively.

(Drying Characteristics Evaluation)

When a diffusing agent composition is dried on a printing machine, print cracking is produced on a printed coating film. Thus, whether or not print cracking is observed on a coating film formed on the semiconductor substrates were visually checked, and the drying characteristics of the diffusing agent compositions on the printing machine were evaluated (AA: no print cracking, A: little print cracking is observed but is acceptable for the manufacturing of a solar cell, B: unacceptable level of print cracking is observed). The drying characteristics on the roll coater was evaluated for the exemplary embodiments 1-7 and the comparative examples 1, 2, and 4, and the drying characteristics on the screen printing machine was evaluated for the exemplary embodiments 8-17 and the comparative examples 3 and 5. The results of the exemplary embodiments 1-7, the results of the exemplary embodiments 8-14, the results of the exemplary embodiments 15-17, and the results of the comparative examples 1-5 are shown in Tables 1, 2, 3, and 4, respectively. The degree of being "acceptable for the manufacturing of a solar cell" and the degree of being "unacceptable level" can be determined by a skilled person in the art based on experiments, etc.

(Carbon Residue Evaluation)

After the thermal diffusion of the impurity-diffusing component (A), whether a carbon residue is observed on the respective surfaces of the semiconductor substrates was visually evaluated. In the evaluation, "Yes" was entered when a carbon residue was observed, and "No" was entered when no carbon residue was observed. The results of the exemplary embodiments 1-7, the results of the exemplary embodiments 8-14, the results of the exemplary embodiments 15-17, and the results of the comparative examples 1-5 are shown in Tables 1, 2, 3, and 4, respectively.

(Diffusibility Evaluation)

The sheet resistance values of impurity diffusion layers formed in the respective semiconductor substrates were measured based on a four-point probe method using a sheet resistance meter (VR-70 manufactured by Kokusai Electric Co., Ltd.). The results of the exemplary embodiments 1-7, the results of the exemplary embodiments 8-14, the results of the exemplary embodiments 15-17, and the results of the comparative examples 1-5 are shown in Tables 1, 2, 3, and 4, respectively.

As shown in Tables 1-3, in all the exemplary embodiments, no carbon residue was observed, and low sheet resistance values were shown, exhibiting good drying characteristics and apparatus washability. As shown in Table 4, in the comparative examples 1 and 2 where a resin whose decomposition temperature is 400 degrees Celsius was contained as the binder resin (B), a carbon residue was observed, and the sheet resistance values were considerably high compared to the exemplary embodiments. In the comparative examples 3 and 5 where the $SiO_2$ fine particles were not contained, the sheet resistance values were higher than those of the exemplary embodiments. In the comparative examples 3 and 4 where the organic solvent was not contained, print cracking was observed. Further, the comparative example 3 where the binder resin (B) was composed of a silane-based resin exhibited poor apparatus washability.

In the diffusing agent compositions according to the exemplary embodiments 1-6 and 8-17 where the organic solvent (D1) was contained such that the organic solvent (D1) accounted for at least 10 percent by mass of the entire mass of the organic solvent (D), better results were obtained with regard to the drying characteristics compared to the exemplary embodiment 7 where the amount of the organic solvent (D1) contained accounted for less than 10 percent (8 percent) by mass. Since the binder resin (B) in the comparative example 3 was a silane compound, no carbon residue was observed.

The invention claimed is:

1. A diffusing agent composition used to print an impurity diffusion component onto a semiconductor substrate, comprising:
   an impurity diffusion component (A):
   a binder resin (B) that thermally decomposes and disappears below a temperature at which the impurity-diffusing component (A) starts to thermally diffuse into the semiconductor substrate, wherein the binder resin (B) comprises an acrylic resin comprising at least one polymerizable monomer selected from the group consisting of methyl methacrylate (MMA), methacrylic acid (MAA), isobutyl methacrylate (i-BMA), tertiary-butyl methacrylate (t-BMA), acrylic acid, ethyl acrylate, methyl acrylate, butyl acrylate, isobutyl acrylate, ethyl methacrylate, and butyl methacrylate;

a $SiO_2$ fine particle (C); and an organic solvent (D) comprising an organic solvent (D1) having a boiling point of at least 100° C., wherein the amount of the impurity-diffusing component (A) is 5 to 9 percent by mass with respect to the entire mass of the composition and 5 to 50 percent by mass with respect to the entire mass of the following solid components of the composition: the impurity-diffusing component (A), the binder resin (B), and the $SiO_2$ fine particle (C).

2. The diffusing agent composition according to claim 1 wherein the decomposition temperature of the binder resin (B) is less than 200° C.

3. The diffusing agent composition according to claim 1 wherein the decomposition temperature of the binder resin (B) is less than 400 degrees Celsius.

4. The diffusing agent composition according to claim 1 wherein the organic solvent (D1) accounts for at least 10 percent by mass of the entire mass of the organic solvent (D).

5. A method for forming an impurity diffusion layer, comprising:

forming a coating film by printing the diffusing agent composition according to claim 1 onto a semiconductor substrate; and diffusing the impurity diffusion component (A) of the diffusing agent composition into the semiconductor substrate.

6. The method for forming an impurity diffusion layer according to claim 5 wherein the diffusing agent composition is printed onto the semiconductor substrate by a roll coat printing method or a screen printing method in the forming of the coating film.

7. The diffusing agent composition according to claim 1, further comprising a solvent selected from the group consisting of ethanol, isopropanol, methyl ethyl ketone, acetone, ethyl acetate, methanol, n-hexane and cyclohexane.

* * * * *

UNITED STATES PATENT AND TRADEMARK OFFICE
CERTIFICATE OF CORRECTION

PATENT NO.       : 9,620,367 B2
APPLICATION NO.  : 13/391907
DATED            : April 11, 2017
INVENTOR(S)      : Takaaki Hirai et al.

It is certified that error appears in the above-identified patent and that said Letters Patent is hereby corrected as shown below:

In the Specification

Column 15, Line 23, "degreed" should be --degrees--.

Column 15, Line 26, "degreed" should be --degrees--.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*